United States Patent
Roy et al.

(10) Patent No.: US 6,692,579 B2
(45) Date of Patent: Feb. 17, 2004

(54) METHOD FOR CLEANING SEMICONDUCTOR STRUCTURES USING HYDROCARBON AND SOLVENTS IN A REPETITIVE VAPOR PHASE/LIQUID PHASE SEQUENCE

(75) Inventors: Sudipto Ranendra Roy, Singapore (SG); Yi Xu, Singapore (SG); Simon Chooi, Singapore (SG); Yakub Aliyu, Singapore (SG); Mei Sheng Zhou, Singapore (SG); John Leonard Sudijono, Singapore (SG); Paul Kwok Keung Ho, Singapore (SG); Subhash Gupta, Singapore (SG)

(73) Assignee: Chartered Semiconductor Manufacturing Ltd., Singapore (SG)

( * ) Notice: Subject to any disclaimer, the term of this patent is extended or adjusted under 35 U.S.C. 154(b) by 155 days.

(21) Appl. No.: 09/764,244

(22) Filed: Jan. 19, 2001

(65) Prior Publication Data

US 2002/0096190 A1 Jul. 25, 2002

(51) Int. Cl.$^7$ .............................. B08B 3/00; B08B 5/04
(52) U.S. Cl. .............................. 134/21; 134/31; 134/32; 34/402; 34/468
(58) Field of Search .............................. 134/21, 18, 31, 134/32; 34/402, 403, 404, 418, 419, 434, 448, 449, 467, 468

(56) References Cited

U.S. PATENT DOCUMENTS

| | | |
|---|---|---|
| 4,581,101 A | 4/1986 | Senoue et al. .............. 156/643 |
| 4,983,548 A | 1/1991 | Uno et al. .................. 437/250 |
| 5,055,138 A | 10/1991 | Slinn ............................ 134/11 |
| 5,246,501 A | 9/1993 | Rodgers et al. ................ 134/10 |
| 5,494,526 A | 2/1996 | Paranjpe ........................ 134/1 |
| 5,641,541 A | 6/1997 | Chen ........................ 427/255.6 |
| 5,990,014 A | 11/1999 | Wilson et al. .............. 438/706 |
| 6,026,588 A | * 2/2000 | Clark et al. ..................... 34/77 |

* cited by examiner

Primary Examiner—Zeinab El-Arini
(74) Attorney, Agent, or Firm—George O. Saile; Rosemary L. S. Pike; Stephen G. Stanton

(57) ABSTRACT

A method for cleaning a semiconductor structure using vapor phase condensation with a thermally vaporized cleaning agent, a hydrocarbon vaporized by pressure variation, or a combination of the two. In the thermally vaporized cleaning agent process, a semiconductor structure is lowered into a vapor blanket in a thermal gradient cleaning chamber at atmospheric pressure formed by heating a liquid cleaning agent below the vapor blanket and cooling the liquid cleaning agent above the vapor blanket causing it to condense and return to the bottom of the thermal gradient cleaning chamber. The semiconductor structure is then raised above the vapor blanket and the cleaning agent condenses on all of the surfaces of the semiconductor structure removing contaminants and is returned to the bottom of the chamber by gravity. In the pressurized hydrocarbon process, a semiconductor structure is placed into a variable pressure cleaning chamber, having a piston which changes the pressure by reducing or increasing the volume of the chamber. The semiconductor structure first exposed to the hydrocarbon in vapor phase, then the piston is lowered to condense the hydrocarbon. A semiconductor structure can be cleaned by either or both of these processes by repetitive vaporization/condensation cycles.

7 Claims, 4 Drawing Sheets

METHOD FOR CLEANING SEMICONDUCTOR STRUCTURES USING HYDROCARBON AND SOLVENTS IN A REPETITIVE VAPOR PHASE/LIQUID PHASE SEQUENCE

BACKGROUND OF INVENTION

1) Field of the Invention

This invention relates generally to fabrication of a semiconductor device and more particularly to a method for cleaning complex semiconductor geometries (e.g. high aspect ratio openings) using hydrocarbon and solvents in a repetitive vapor phase/liquid phase sequence.

2) Description of the Prior Art

In semiconductor manufacturing, it is very important to remove contaminants which accumulate on semiconductors during fabrication. Contaminants can cause high resistance, adhesion problems for subsequent layers, reduced insulation, and other performance and reliability problems. Typically, liquid cleaning processes are used to remove contaminants. However, as device geometries continue to shrink, it becomes difficult for liquid cleaning agents to adequately penetrate vias and other complex geometries. Also, as geometries continue to shrink, performance margins decrease and the cleanliness level of semiconductors must increase. Liquid cleaning agents can recontaminate a semiconductor with contaminants previously removed and suspended or dissolved in the cleaning agent.

The importance of overcoming the various deficiencies noted above is evidenced by the extensive technological development directed to the subject, as documented by the relevant patent and technical literature. The closest and apparently more relevant technical developments in the patent literature can be gleaned by considering the following patents.

U.S. Pat. No. 5,494,526 (Paranjpe) shows a method for cleaning semiconductor wafers using liquified gases. Paranjpe teaches introducing a liquid phase cleaning agent to the surface of a semiconductor wafer, then causing the liquid phase cleaning agent to change to a vapor phase using vibration, heat, pressure, or a combination thereof. Paranje also teaches that the cleaning agent can penetrate into the intricate topography of the semiconductor substrate surface in vapor phase, then condense to remove particulates and contaminants in difficult to reach (e.g. small) openings. The cleaning agent can be: liquefied argon, liquefied nitrogen, non-polar (e.g. $N_2$, $O_2$, $CO_2$) or alkaline ($NH_3$) liquified gases, Freon, or acidic liquified gases (e.g. HCl, HBr, HF, $SO_3$). The cleaning agent is removed by flash evaporation using a rapid pressure drop (e.g. vacuum). If multiple cleaning steps are required to adequately clean the wafer, the entire sequence is repeated.

U.S. Pat. No. 5,990,014 (Wilson) shows a wafer cleaning process using hydrocarbons and vaporous acids.

U.S. Pat. No. 5,055,138 (Slinn) teaches a vapor cleaning process using a highly fluorinated organic cleaning agent and a flammable solvent, with a recycling condensation process. This invention does not address removing the cleaning agent from small openings.

U.S. Pat. No. 4,581,101 (Senoune et al.) discloses a method for dry-etching and cleaning using a fluorinated ether gas.

U.S. Pat. No. 5,641,541 (Chen) discloses a method for applying a primer to a wafer surface, in a gaseous state, prior to photoresist application.

U.S. Pat. No. 4,983,548 (Uno et al.) teaches a method of removing electrical charge from a semiconductor device using a volatile organic solvent, then removing the volatile organic solvent by evaporation.

U.S. Pat. No. 5,246,501 (Rodgers et al.) teaches a method of flash drying parts following vapor degreasing.

SUMMARY OF THE INVENTION

It is an object of the present invention to provide a method for cleaning semiconductor structures with complex topographies, including very small openings, using hydrocarbon and solvents.

It is another object of the present invention to provide a method for cleaning vias for sub-quartermicron dual damascene devices using hydrocarbon and solvents.

It is another object of the present invention to provide a method according to the previous objects using repetitive vapor phase condensation and revaporization.

It is yet another object of the present invention to provide an economical and effective method for cleaning semiconductor structures with complex topographies.

To accomplish the above objectives, the present invention provides a method for cleaning a semiconductor structure using vapor phase condensation. The semiconductor structure can be cleaned using vapor phase condensation with a thermally vaporized cleaning agent, a hydrocarbon vaporized by pressure variation, or a combination of the two. In the thermally vaporized cleaning agent process, a semiconductor structure is lowered into a vapor blanket in a thermal gradient cleaning chamber at atmospheric pressure formed by heating a liquid cleaning agent below the vapor blanket and cooling the liquid cleaning agent above the vapor blanket causing it to condense and return to the bottom of the thermal gradient cleaning chamber. The semiconductor structure is then raised above the vapor blanket and the cleaning agent condenses on all of the surfaces of the semiconductor structure removing contaminants and is returned to the bottom of the chamber by gravity. In the pressurized hydrocarbon process, a semiconductor structure is placed into a variable pressure cleaning chamber, having a piston which changes the pressure by reducing or increasing the volume of the chamber. The semiconductor structure first exposed to the hydrocarbon in vapor phase, then the piston is lowered to condense the hydrocarbon. A semiconductor structure can be cleaned by either or both of these processes by repetitive vaporization/condensation cycles.

The present invention provides considerable improvement over the prior art. A semiconductor structure having a complex topography can be effectively and economically cleaned using vapor phase condensation. Also, the semiconductor structure is not recontaminated by contaminants which have been previously removed.

The present invention achieves these benefits in the context of known process technology. However, a further understanding of the nature and advantages of the present invention may be realized by reference to the latter portions of the specification and attached drawings.

BRIEF DESCRIPTION OF THE DRAWINGS

The features and advantages of a semiconductor device according to the present invention and further details of a process of fabricating such a semiconductor device in accordance with the present invention will be more clearly understood from the following description taken in conjunction with the accompanying drawings in which like reference numerals designate similar or corresponding elements, regions and portions and in which.

DETAILED DESCRIPTION OF THE INVENTION

The present invention will be described in detail with reference to the accompanying drawings. The present invention provides a method for cleaning a semiconductor structure (11) using hydrocarbon and solvents in a repetitive vapor phase/liquid phase sequence.

Figure 1:
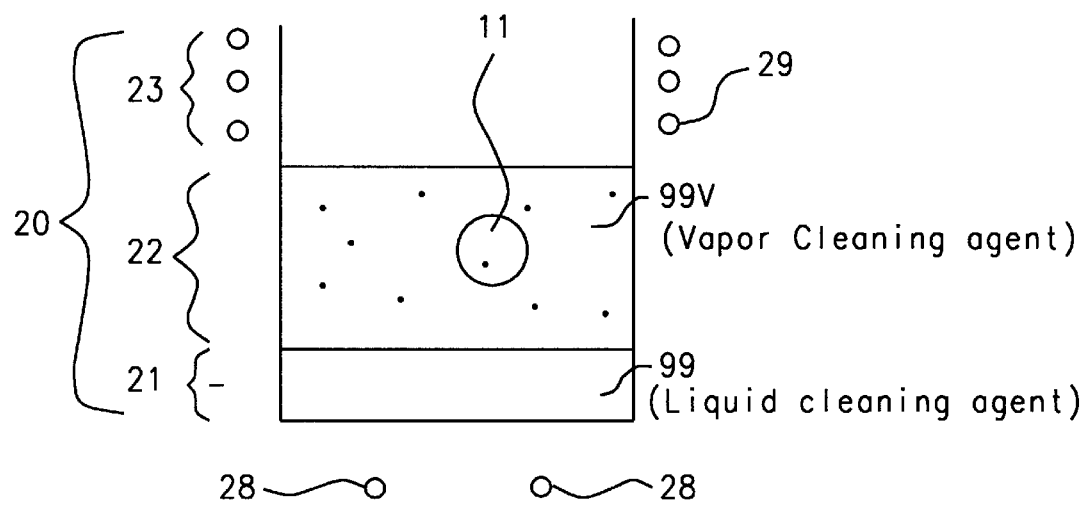
FIGS. 1 and 2 illustrate sequential views of a process for cleaning semiconductor structures using vapor phase condensation according to a first embodiment of the present invention.
Figure 3:
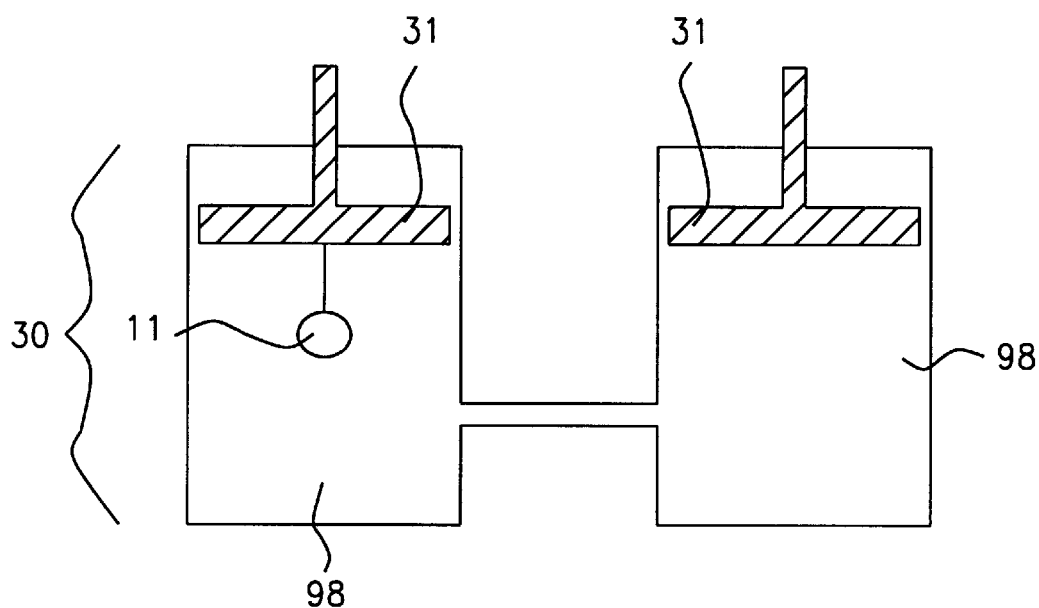
FIGS. 3 and 4 illustrate sequential views of a process for cleaning semiconductor structures using vapor phase condensation according to a second embodiment of the present invention.
Figure 5A:
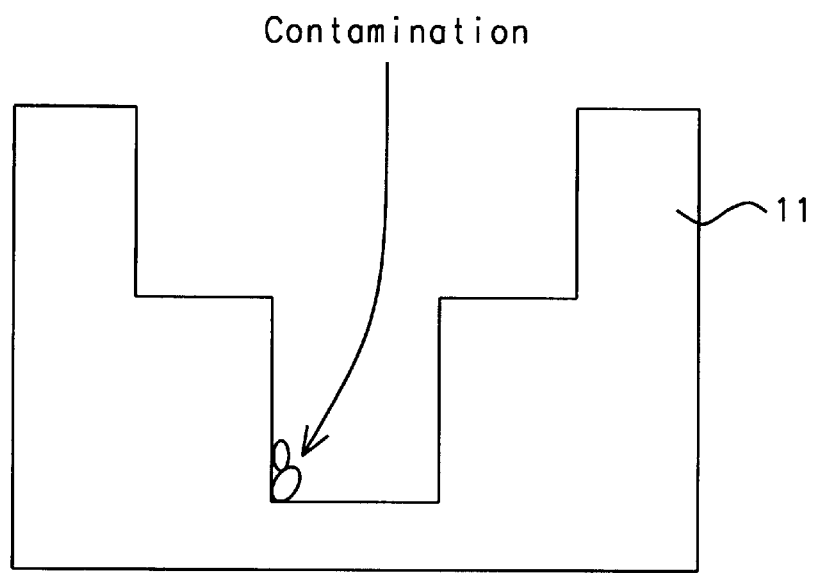
FIGS. 5A, 5B, 5C and 5D illustrate how contamination is removed from surfaces of a semiconductor structure by the process of the present invention.

Referring to FIGS. 1 and 3, a semiconductor structure (11) is provided. Semiconductor structure (11) should be understood to possibly comprise a wafer or substrate of semiconducting material, such as monocrystalline silicon, or one of a number of like structures known in the art, such as a silicon-on-insulator (SOI) structure. Semiconductor structure (11) should be understood to possibly further comprise one or more conductive and/or insulating layers formed on the substrate or the like, as well as one or more active and/or passive devices formed on or over the substrate or the like. While the method of the present invention is effective in cleaning semiconductor structures, it is particularly advantageous for small design rule semiconductors (e.g. sub-quartermicron), due to its ability to penetrate small openings. The semiconductor structure (11) typically has contamination on its surface as is shown in FIG. 5A.

First Embodiment

The semiconductor structure (11) is placed in a thermal gradient cleaning chamber (20). The thermal gradient cleaning chamber (20) comprises three vertical regions. The first region (21) containing a cleaning agent (99) in liquid phase is on the bottom. The second region (22) containing the cleaning agent in vapor phase (99V) is in the middle.

The third region, which is free of the cleaning agent (99) is on the top. The thermal gradient cleaning chamber (20) has a heating element (28) proximate to the first region (21) and a cooling element (29) proximate to the third region. Heat is supplied to the first region (21) using the heating element (28) at a sufficient temperature to induce vaporization of the cleaning agent (99). The third region (23) is sufficiently cooled, using the cooling element (29) to induce condensation of the cleaning agent (99). The condensed cleaning agent is returned to the first region (21) by gravity. In the second region (22) the cleaning agent in vapor phase (99V) reaches an equilibrium concentration of 100%. The cleaning chamber and condensing coils are preferably quartz lined to maintain cleanliness and purity of the ambient.

The cleaning agent (99) can comprise IPA, ethylene, propylene, butane, or isobutane. For a cleaning agent comprising hydrocarbon, the first region (21) is heated to a temperature of between about 50C and 500C, and the second region is cooled to a temperature of between about 0C and 50C. A key advantage of the present invention is that cleaning can be performed at atmospheric pressure, increasing throughput and reducing processing cost.

Still referring to FIG. 1, the semiconductor structure (11) is lowered into the second region (22) of the thermal gradient cleaning chamber (20), whereby the cleaning agent in a vapor phase (99V) penetrates openings in the semiconductor structure (11), transporting freely to all surfaces of the semiconductor structure (11). The semiconductor structure (11) is preferably positioned in the vapor phase cleaning agent (e.g. vapor blanket) (99V) in the second region (22) for a time of between about 10 seconds and 200 seconds.

Figure 2:
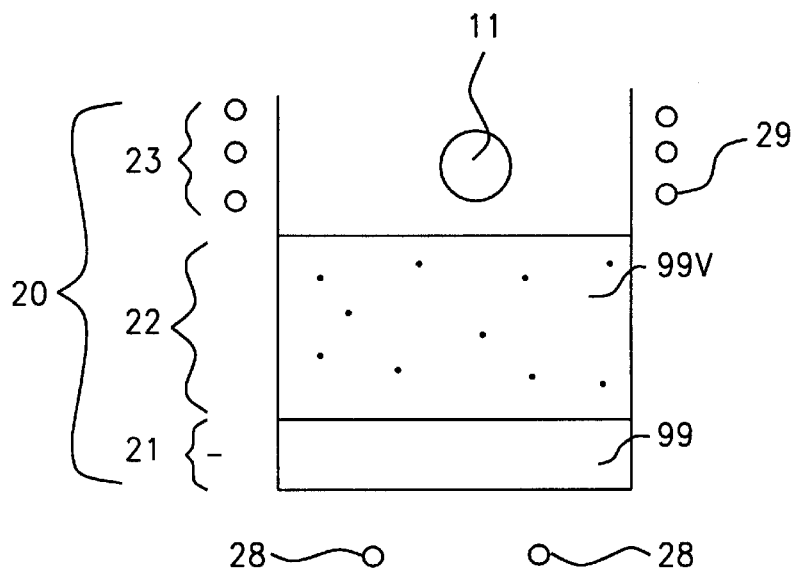

Referring to FIG. 2, the semiconductor structure (11) is raised into the third region (23) of the thermal gradient cleaning chamber (20), whereby the cleaning agent (99) condenses to liquid phase, collecting contaminants, and is returned to the first region by gravity. The semiconductor structure is preferably positioned in the third region (23) for a period of between about 20 seconds and 200 seconds.

The semiconductor structure (11) is then lowered into the second region again, where vapor phase cleaning agent (99V) is freely transported to all surfaces of the semiconductor structure. Then the semiconductor structure is raised into the third region again, where the cleaning agent (99) condenses and falls back to the first region, carrying contaminants with it. This vapor/condensation cycle is repeated until the semiconductor structure is sufficiently cleaned.

The end-point (e.g. time when the semiconductor structure is sufficiently cleaned) can be determined by one of two methods. The number of cycles required to reach a cleanliness level, at which adequate performance and reliability test results are acheived, can be empirically determined for a particular semiconductor structure and process. Alternatively, the cleanliness level can be measured on the semiconductor being cleaned, until a pre-determined cleanliness level is achieved.

After the desired cleanliness level has been achieved, the semiconductor structure is removed from the thermal gradient cleaning chamber (20) and placed in a vacuum chamber at a temperature of between about 50° C. and 400° C., where any residual cleaning agent (99) is desorbed and removed from the semiconductor structure.

A key advantage of the present invention is that the semiconductor structure (11) is not lowered into the liquid phase cleaning agent. This is important because liquid cleaning agents can be very dirty, containing particles, ions, and metallics. When the cleaning agent is in vapor form it has a high purity and does not re-contaminate the semiconductor structure.

Second Embodiment

In the second embodiment, as shown in FIG. 3, the semiconductor structure (11) is placed in a variable volume cleaning chamber (30) containing a quantity of a hydrocarbon (98). The variable volume cleaning chamber has a pressure-tight piston (31), whereby the volume of the cleaning chamber can be decreased by lowering the piston and increased by raising the piston. The hydrocarbon can comprise, but is not limited to ethylene, propylene, butane, isobutane, or a combination of thereof In order to achieve an adequate pressure variation, the variable pressure cleaning chamber preferably comprises two chambers connected together wherein both chambers have a piston (31). The pressure in the variable pressure cleaning chamber (30) is preferably atmospheric pressure with the piston(s) fully up, and the pressure with the piston(s) fully down is sufficient to cause condensation of the hydrocarbon (98). The reaction is preferably adiabatic (e.g., minimal heat loss).

Referring to FIG. 3, the semiconductor structure (11) is placed into the variable volume cleaning chamber with the piston(s) (31) positioned to provide the maximum volume wherein the pressure is at the ambient atmospheric pressure and the hydrocarbon (98) is in a vapor phase. The semiconductor structure can, for example, be held by a chuck, attached to the piston (31) or hanged by an edge gripper. The semiconductor structure (11) is preferably exposed to the vapor phase hydrocarbon (98) for a time of between about 20 seconds and 200 seconds. The vapor phase hydrocarbon is transported freely into openings and onto all surfaces of the semiconductor structure.

Figure 4:
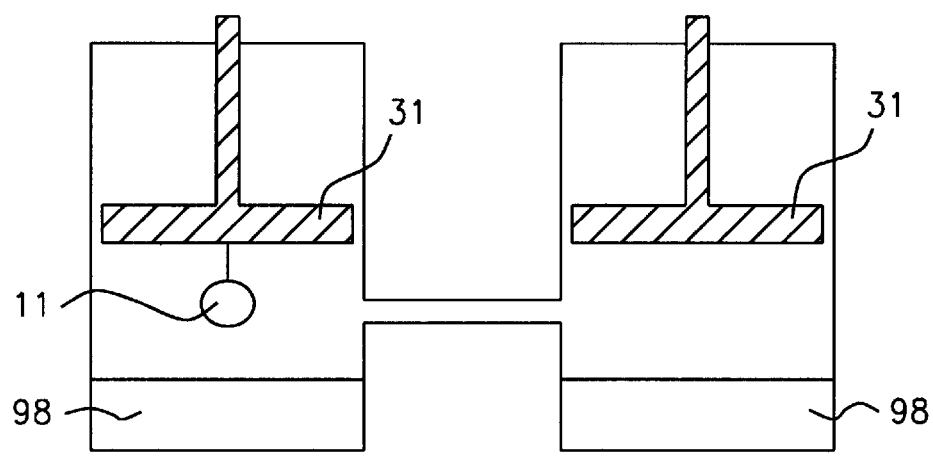

Referring to FIG. 4, the piston(s) (31) is lowered, causing the pressure to increase and the hydrocarbon (98) to condense to liquid phase. For a hydrocarbon comprising hydrocarbon, the pressure increases to between about 0 torr and 6000 torr. The pressure is preferably held at a high enough level to prevent vaporization of the hydrocarbon (98) for a time of between about 20 seconds and 200 seconds. The liquid phase hydrocarbon removes contaminants from the surfaces of the semiconductor structure (11) and is taken away from the semiconductor structure (11) to the bottom of the variable pressure cleaning chamber by gravity.

Referring again to FIG. 3, the piston is raised to its initial position, whereby the hydrocarbon vaporizes, and the contaminants remain at the bottom of the variable pressure chamber (30). This adiabatic vaporization/condensation cycle is repeated until the semiconductor structure is sufficiently cleaned. Either the number of cycles or the required cleanliness level can be determined as described above.

Figure 5B:
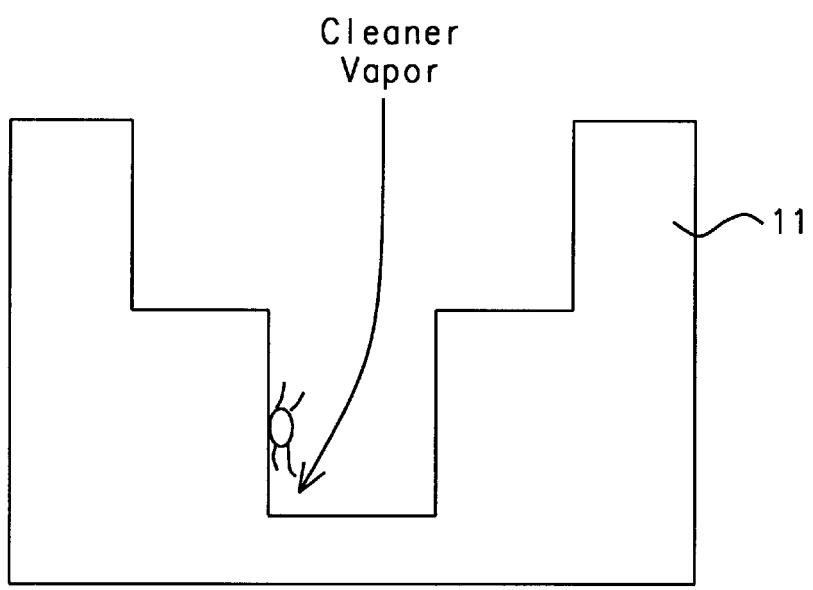
Figure 5C:
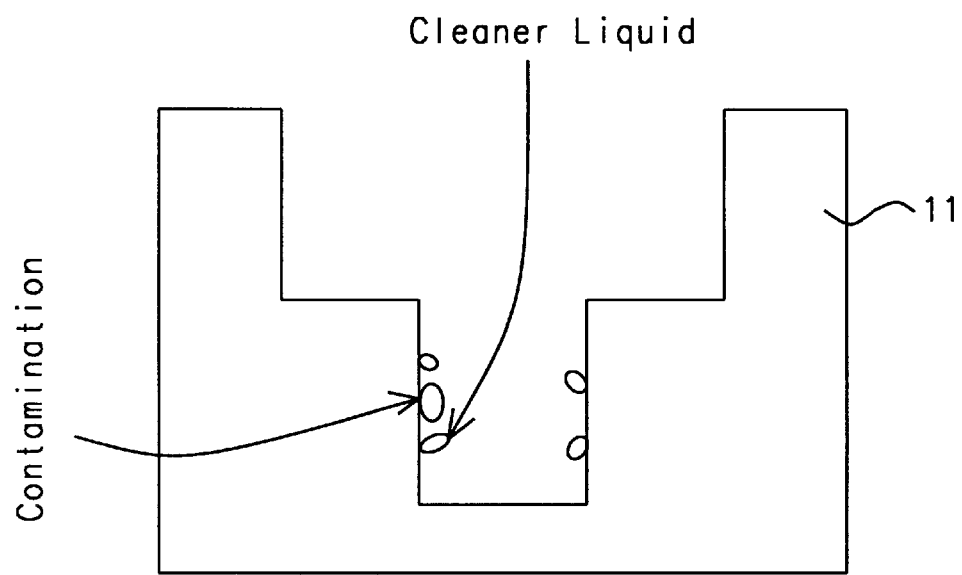
Figure 5D:
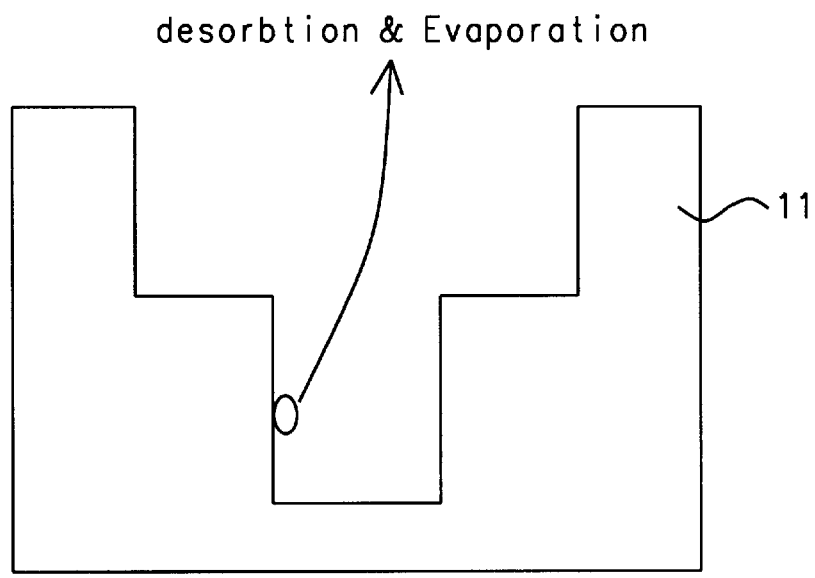

FIGS. 5B, 5C and 5D illustrate how contamination is removed from surfaces of a semiconductor wafer 11 by the process of the present invention, regardless of which embodiment is employed.

FIG. 5B corresponds to the conditions of FIG. 1, for example, when the semiconductor structure (11) is lowered into the second region (22) of the thermal gradient cleaning chamber (20) whereby the cleaning agent in a vapor phase (99V) penetrates openings in the semiconductor structure (11) as illustrated as "cleaner vapor" in FIG. 5B.

FIGS. 5C and 5D corresponds to the conditions of FIG. 2, for example, when the semiconductor structure (11) is raised into the third region (23) of the thermal gradient cleaning chamber (20) whereby the cleaning agent (99) condenses to liquid phase (as illustrated as "cleaner liquid" in FIG. 5C), collecting contaminants (as illustrated as "contamination" in FIG. 5C), and is returned to the first region by gravity as illustrated in FIG. 5D.

The steps illustrated in FIGS. 5B through 5D may be repeated until the semiconductor structure (11) is sufficiently cleaned.

A semiconductor structure (11) can be cleaned by either the first embodiment, the second embodiment, or a combination of the first and second embodiments. The key advantages of the present invention are that a semiconductor structure having a complex topography can be effectively and economically cleaned using vapor phase condensation. Also, the semiconductor structure is not re-contaminated by contaminants which have been previously removed.

While the invention has been particularly shown and described with reference to the preferred embodiments thereof, it will be understood by those skilled in the art that various changes in form and details may be made without departing from the spirit and scope of the invention.

What is claimed is:

1. A method for cleaning a semiconductor structure, comprising the steps of:
   a) providing a variable pressure cleaning chamber containing a quantity of a cleaning agent and having a volume; said cleaning chamber having a pressure-tight piston; whereby said volume of said cleaning chamber can be decreased to a minimum volume by lowering said piston and increased to a maximum volume by raising said piston;
   b) placing a semiconductor structure into said cleaning chamber with said piston positioned to provide said maximum volume; whereby said cleaning agent is in vapor phase;
   c) lowering said piston; whereby said vapor phase cleaning agent in contact with said semiconductor structure condenses to a liquid phase;
   d) raising said piston; whereby said cleaning agent vaporizes; and
   e) repeating steps c and d until said semiconductor structure is sufficiently clean by removing any contaminant from said semiconductor structure.

2. The method of claim 1 wherein steps c and d are repeated one or more times.

3. The method of claim 1 wherein said cleaning agent comprises at least one of butane, isobutane, IPA, ethylene, or polypropylene.

4. The method of claim 3 wherein said piston is lowered in step c until a pressure of between about 0 torr and 6000 torr is reached.

5. A method for cleaning a semiconductor structure, comprising the steps of:
   a) providing a thermal gradient cleaning chamber at atmospheric pressure comprising three vertical regions including a bottom, a middle and a top; wherein the first region, containing a cleaning agent in liquid phase, is on the bottom; the second region, containing the cleaning agent in vapor phase, is in the middle; and the third region, which is free of the cleaning agent, is on the top; said cleaning chamber having a heating element proximate to said first region which vaporizes said cleaning agent and a cooling element proximate to said third region which condenses said cleaning agent;
   b) providing a variable pressure cleaning chamber containing a quantity of a cleaning agent and having a volume; said cleaning chamber having a pressure-tight piston; whereby said volume of said cleaning chamber can be decreased by lowering said piston and increased by raising said piston;
   c) locating a semiconductor structure in said second region; whereby said cleaning agent penetrates openings in said semiconductor structure;
   d) moving the semiconductor structure to said third region; whereby said cleaning agent on said semiconductor structure condenses to liquid phase;
   e) repeating steps b and c one or more times;
   f) removing said semiconductor structure from said thermal gradient cleaning chamber and placing said semiconductor structure into a vacuum chamber; whereby residual cleaning agent is removed from said semiconductor structure;
   g) removing said semiconductor structure from said vacuum chamber and placing said semiconductor structure into said variable pressure cleaning chamber with said piston positioned to provide the maximum volume; whereby said cleaning agent is in a vapor phase;
   h) lowering said piston; whereby said cleaning agent condenses to a liquid phase;
   i) raising said piston; whereby said cleaning agent vaporizes; and
   j) repeating steps c and d until said semiconductor structure is sufficiently clean.

6. The method of claim 5 wherein said cleaning agent comprises hydrocarbon.

7. The method of claim 6 wherein said cleaning agent in vapor phase in said second region of said cleaning chamber has a concentration of about 100%; and the pressure of said cleaning chamber in step h is between about 0 torr and 6000 torr.

* * * * *